(12) United States Patent
Conte et al.

(10) Patent No.: US 9,484,872 B1
(45) Date of Patent: Nov. 1, 2016

(54) AMPLIFIER CIRCUIT WITH STATIC CONSUMPTION CONTROL AND CORRESPONDING CONTROL METHOD

(71) Applicant: STMICROELECTRONICS S.R.L., Agrate Brianza (IT)

(72) Inventors: Antonino Conte, Tremestieri Etneo (IT); Alberto Jose' Di Martino, Palagonia (IT)

(73) Assignee: STMICROELECTRONICS S.R.L., Agrate Brianza (MB) (IT)

( * ) Notice: Subject to any disclaimer, the term of this patent is extended or adjusted under 35 U.S.C. 154(b) by 0 days.

(21) Appl. No.: 14/969,042

(22) Filed: Dec. 15, 2015

(30) Foreign Application Priority Data

Jun. 17, 2015 (IT) ........................ 102015000024736

(51) Int. Cl.
*H03F 3/45* (2006.01)
*H03M 1/66* (2006.01)
*G11C 16/12* (2006.01)
*G11C 5/14* (2006.01)

(52) U.S. Cl.
CPC ........... *H03F 3/45179* (2013.01); *G11C 5/145* (2013.01); *G11C 16/12* (2013.01); *H03M 1/66* (2013.01); *H03F 2203/45116* (2013.01)

(58) Field of Classification Search
CPC ........................................................ H03F 3/45
USPC ........................................................ 330/260
See application file for complete search history.

(56) References Cited

U.S. PATENT DOCUMENTS

| | | | |
|---|---|---|---|
| 6,344,521 B1* | 2/2002 | Schwindeman | .......... C08F 4/48 525/100 |
| 6,433,521 B1 | 8/2002 | Chen et al. | |
| 7,764,054 B1* | 7/2010 | Guo | ...................... H02M 3/156 323/224 |
| 2006/0197513 A1* | 9/2006 | Tang | ....................... G05F 1/575 323/273 |
| 2008/0252277 A1* | 10/2008 | Sase | ...................... H02M 3/157 323/283 |
| 2008/0298105 A1* | 12/2008 | Kashima | ................. H02M 1/32 363/126 |
| 2009/0302820 A1* | 12/2009 | Shimizu | ................ H02M 3/156 323/285 |
| 2013/0170309 A1* | 7/2013 | Chen | ........................ G11C 7/06 365/207 |
| 2014/0169439 A1* | 6/2014 | Liu | ................... H04L 25/03885 375/233 |

FOREIGN PATENT DOCUMENTS

EP        2299576 A1       3/2011

* cited by examiner

*Primary Examiner* — Min Huang
(74) *Attorney, Agent, or Firm* — Allen, Dyer, Doppelt, Milbrath & Gilchrist, P.A.

(57) ABSTRACT

An amplifier circuit may include an input amplification stage comprising a first amplifier having first and second differential inputs and a first output, and a second amplifier having first and second differential inputs and a second output. The amplifier circuit also includes an output amplification stage having first and second inputs respectively coupled to the first and second outputs of the input amplification stage, and an output configured to supply an output voltage based upon the input voltage by an amplification factor. The amplifier circuit comprises a feedback stage with a common-mode control stage configured to implement a comparison between the first differential voltage and the second differential voltage, and a reference voltage, and generate respective regulation currents on the first and second inputs of the output amplification stage to compensate for a common-mode variation of the first differential voltage and the second differential voltage.

21 Claims, 8 Drawing Sheets

(Prior Art)

AMPLIFIER CIRCUIT WITH STATIC CONSUMPTION CONTROL AND CORRESPONDING CONTROL METHOD

RELATED APPLICATION

The present application is based upon prior filed Italian Application No. 102015000024736 filed Jun. 17, 2015, the entire subject matter of which is incorporated herein by reference in its entirety.

TECHNICAL FIELD

The present disclosure relates to an amplifier circuit, and, more particularly, to use of the amplifier circuit in a digital-to-analog converter device.

BACKGROUND

Digital-to-analog converters are used in flash memories for generating the biasing voltages required during reading, programming, and verifying operations for memory cells. In particular, these memory operations are rather complex, and the voltages required may vary considerably, i.e. a wide range of voltage levels with values very distant from one another. For example, an erase operation may be applied to the gate terminal of an addressed memory cell a voltage ramp, the erase operation having steps of 0.3 V between a minimum voltage of 4 V up to a maximum voltage of 10 V, or else, a so-called "soft programming" operation may be applied to the gate terminal of an addressed memory cell a voltage ramp, the "soft programming" operation having steps of 0.125 V between a minimum voltage of 2.5 V up to a maximum voltage of 7 V.

Furthermore, rapid transitions are generally possible between the various voltage levels generated, both in charging and discharging conditions; the capacitive load conditions are also variable. For example, the capacitive load conditions may vary between a minimum load of 2-3 pF up to a maximum load of 400 pF. The digital-to-analog converter, and in particular a corresponding amplifier circuit that generates the biasing voltages required during the various memory operations, may have stringent requirements from the standpoint of electrical performance.

SUMMARY

Generally speaking, an amplifier circuit may include an input amplification stage comprising a first amplifier having first and second differential inputs and a first output, and a second amplifier having first and second differential inputs and a second output. The first differential input of the first amplifier is coupled to the second differential input of the second amplifier and configured to receive an input voltage, and the second differential input of the first amplifier is coupled to the first differential input of the second amplifier and configured to receive a feedback voltage. The amplifier circuit also may include an output amplification stage having first and second inputs respectively coupled to the first and second outputs of the input amplification stage, and an output configured to supply an output voltage based upon the input voltage by an amplification factor. The amplifier circuit may also comprise a feedback stage coupled to the output of the output amplification stage and configured to generate the feedback voltage as a function of the output voltage. The feedback stage includes a common-mode control stage coupled to the first and second outputs of the input amplification stage for receiving a first differential voltage and a second differential voltage, respectively. The common-mode control stage may be configured to implement a comparison between the first differential voltage and the second differential voltage, and a reference voltage, and generate respective regulation currents on the first and second inputs of the output amplification stage to compensate for a common-mode variation of the first differential voltage and the second differential voltage.

DETAILED DESCRIPTION

Figure 1:
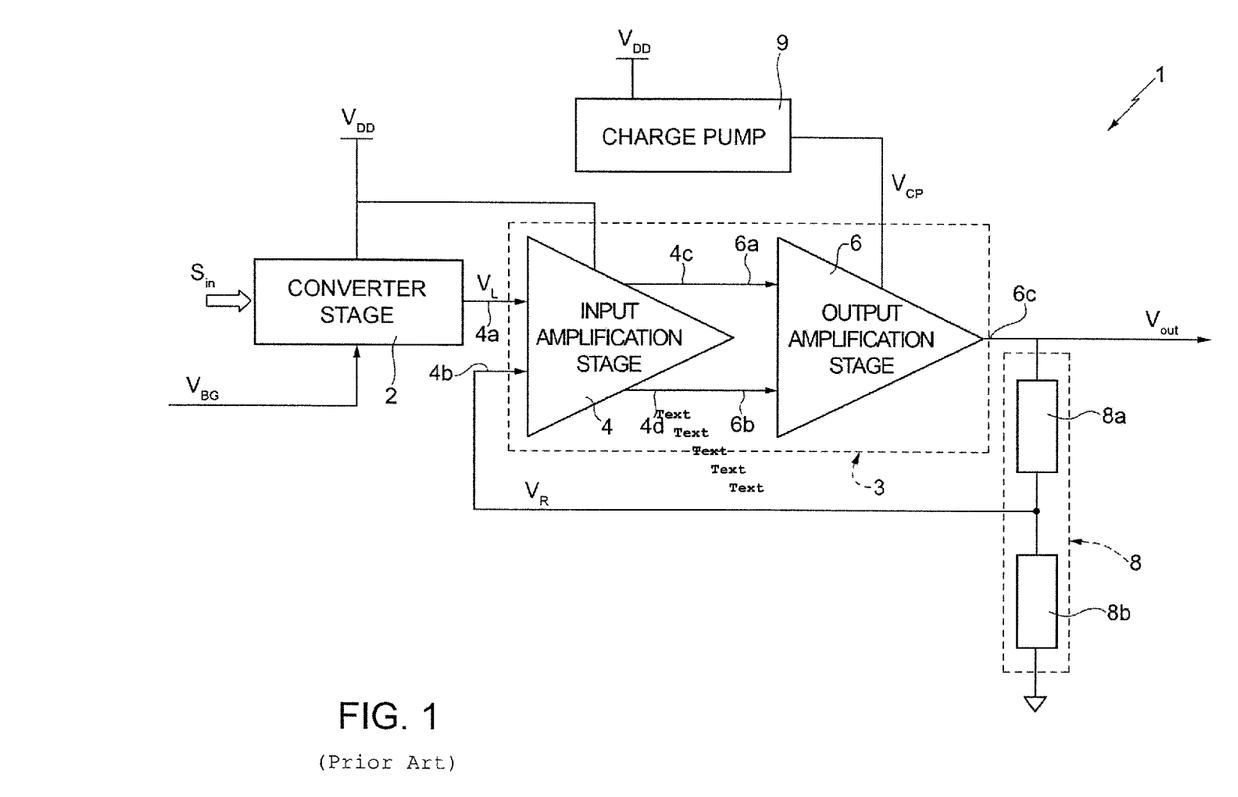
FIG. 1 is a schematic circuit diagram of a digital-to-analog converter device including an amplifier circuit, according to the prior art.

FIG. 1 shows a digital-to-analog converter device 1, which may be used, for example, for generation of the biasing voltages required in a nonvolatile memory of the flash type. The digital-to-analog converter 1 comprises an input conversion stage 2, in particular, of the R2R type (i.e., with a resistive ladder), designed to receive over an input bus, for example, from a control device of the nonvolatile-memory device (not shown), a digital signal Sin indicative of the biasing voltage that is to be generated, and also, for example, from a band-gap generator, a reference voltage VBG. The input conversion stage 2 is further designed to generate an analog input voltage VL, as a function of the digital signal Sin and of the reference voltage VBG.

The digital-to-analog converter 1 further comprises an amplifier circuit 3, which includes an input amplification stage 4, which comprises an operational-amplifier stage, in particular a fully differential trans conductance amplifier (i.e. an Operational Transconductance Amplifier (OTA)), having a first input 4a, which receives the input voltage VL, a second input 4b, which is designed to receive a feedback voltage VR for implementing a voltage control loop, and first and second differential outputs 4c, 4d. The digital-to-analog converter 1 further comprises an output amplification stage 6, which has a first input 6a and a second input 6b coupled to the first and second differential outputs 4c, 4d of the input amplification stage 4, and an output Sc, which defines the output of the amplifier circuit 3 and supplies an output voltage Vout, amplified by a desired amplification factor with respect to the input voltage VL. For example, the total gain of the amplification chain formed by the input amplification stage 4 and by the output amplification stage 6 may be equal to 20.

The digital-to-analog converter 1 further comprises a divider stage 8, which is coupled to the output Sc of the output amplification stage 6 and is designed to supply the feedback voltage VR, as a division of the output voltage Vout, in order to implement feedback control of the value of the same output voltage Vout. In the illustrated example, the divider stage 8 is of the resistive type and thus comprises a first resistor 8a and a second resistor 8b, which are coupled in series between the output 6c and a ground-reference terminal and define a feedback node, present on which is the feedback voltage VR (it is, however, clear that the divider stage 8 could be of the capacitive type, in any case guaranteeing a reduced absorption of electrical current).

A charge pump 9 further generates a boosted voltage VCP of a suitable value, for example, 11 V, starting from a logic supply voltage VDD, for supply of the output amplification stage 6. On account of the high inefficiency of the charge pump 9, the static consumption of the amplifier circuit 3, and in particular of the output amplification stage 6, is required to be particularly low, for any operating condition. In fact, the static consumption is amplified, in use, by the inefficiency factor of the charge pump 9 (which may, for example, be equal to 20).

Figure 2:
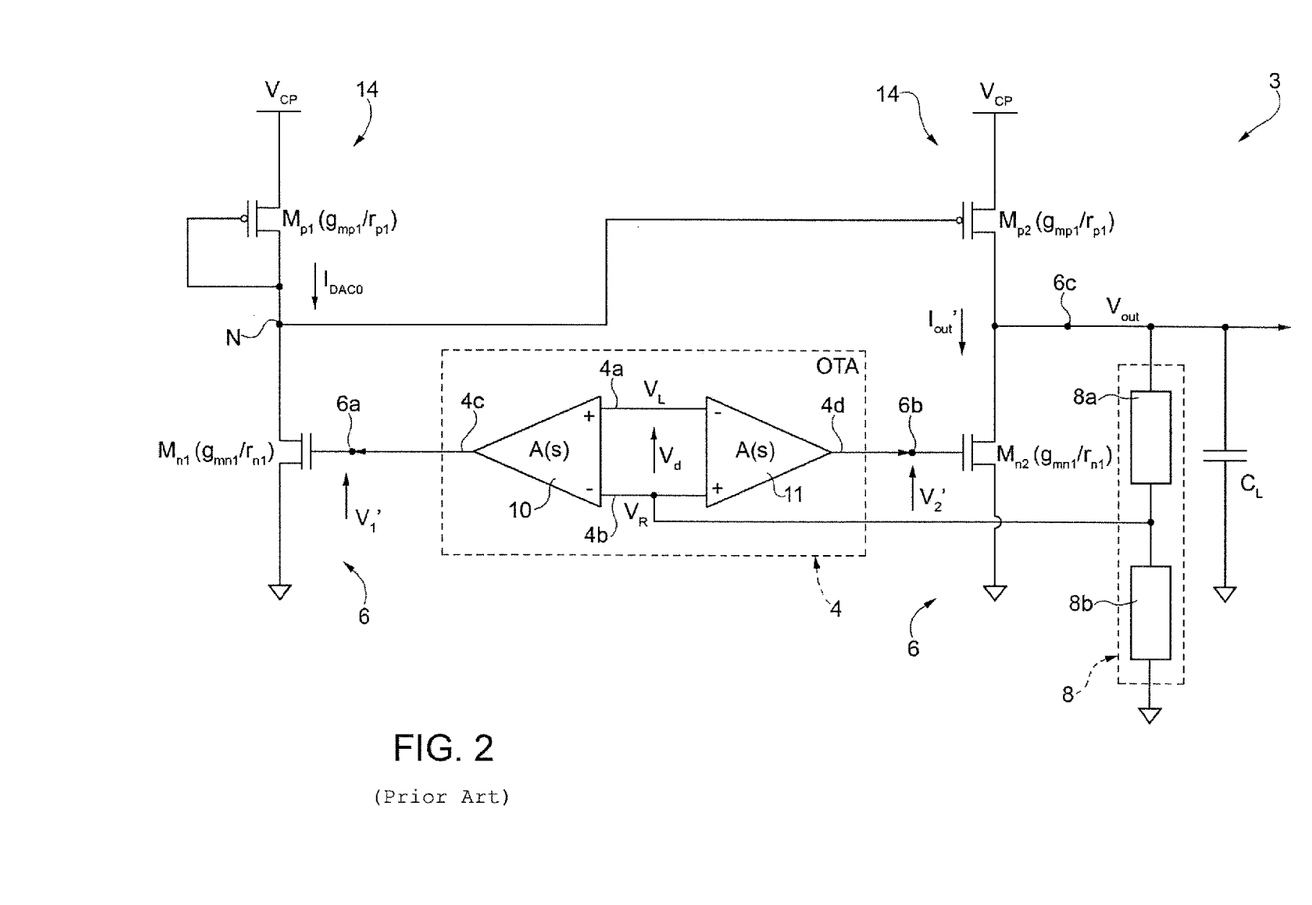
FIG. 2 is a more detailed schematic circuit diagram of the digital-to-analog converter device of FIG. 1.

As illustrated in greater detail in FIG. 2 (where a load capacitor CL coupled to the output 6c of the amplifier circuit 3 is further illustrated), the input amplification stage 4 comprises a first operational amplifier 10 and a second operational amplifier 11, of the OTA type, which have their differential inputs in common (i.e. coupled in parallel at input) and operate in phase opposition. In particular, the non-inverting input of the first operational amplifier 10 is coupled to the inverting input of the second operational amplifier 11 and receives the input voltage VL, whereas the inverting input of the first operational amplifier 10 is coupled to the non-inverting input of the second operational amplifier 11 and receives the feedback voltage VR. Designated by Veda in FIG. 2 is the differential voltage between the inputs of the operational amplifiers 10, 11.

The output amplification stage 6 comprises a first N-metal-oxide semiconductor (MOS) output transistor Mn1, having its gate terminal coupled to the output 4c of the first operational amplifier 10 and on which a first differential voltage V1 is present, a first conduction terminal coupled to an internal node N, and a second conduction terminal coupled to ground. The output amplification stage 6 comprises a second NMOS output transistor Mn2, which has corresponding characteristics (in terms of the resistance rn and transconductance gmn parameters) to those of the first NMOS output transistor Mn1, and has its gate terminal coupled to the output 4d of the second operational amplifier 11 and on which a second differential voltage V2 is present, a first conduction terminal coupled to the output 6c, and a second conduction terminal coupled to ground.

The output amplification stage 6 further comprises a current mirror 14, formed by a first diode-coupled PMOS mirror transistor Mp1, which has its gate terminal coupled to the internal node N, a first conduction terminal that receives, in this example, the boosted voltage VCP from the charge pump 9, and a second conduction terminal coupled to the gate terminal; and a second PMOS mirror transistor Mp2, having its gate terminal coupled to the internal node N, a first conduction terminal that receives, in the example, the boosted voltage VCP from the charge pump 9, and a second conduction terminal coupled to the output 6c. The first and second PMOS mirror transistors Mp1, Mp2 also have corresponding characteristics (in terms of the resistance rp and transconductance gmp parameters).

The amplifier circuit 3 implements a voltage control loop, where the value of the output voltage Vout is determined by the value of the input voltage VL, being substantially equal to $\beta \cdot VL$ (where $\beta$ is the gain of the amplification chain and also corresponds to the inverse of the division factor implemented by the divider stage 8). The above control loop envisions that an increase of the input voltage VL will cause an increase of the differential voltage V1 and a corresponding decrease of the differential voltage V2. Consequently, the output voltage Vout increases, and the feedback voltage VR increases accordingly until it substantially reaches the value of the input voltage VL, bringing the circuit back into the condition of equilibrium.

Figure 3:
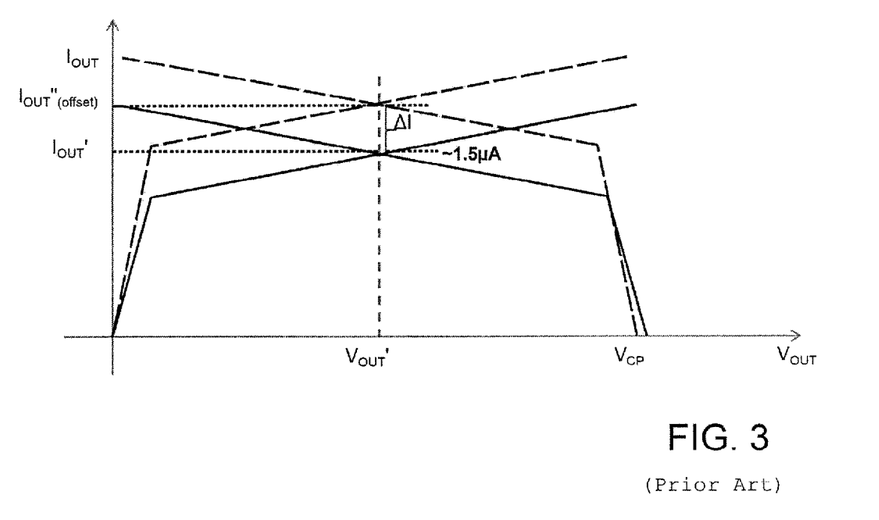
FIG. 3 is a diagram of electrical signals in the amplifier circuit of FIG. 1.

The operating point (or equilibrium point) of the output amplification stage 6 is determined by the crossing point of the output characteristics of the NMOS transistor Mn2 and PMOS transistor Mp2, as illustrated by the solid-line curves in FIG. 3. In particular, corresponding to this operating point is a desired value Vout' of the output voltage Vout, a given value of output current Iout' (which determines the static consumption of the amplifier circuit 3), in the example 1.5 $\mu$A, and values V1' and V2' for the differential voltages V1 and V2.

The present disclosure notes the presence of mismatches in the amplifier circuit 3. In particular, mismatches in the characteristics of the NMOS transistors Mn1, Mn2, of the PMOS transistors Mp1, Mp2, and of the operational amplifiers 10 and 11, may cause an unbalancing of the differential inputs 4a, 4b of the input amplification stage 4. This unbalancing is represented schematically as an offset, designated by Vos in FIG. 4, assumed as being concentrated in a voltage generator at the input of the operational amplifiers 10, 11 (by way of example, the offset Vos is represented on the non-inverting input of the first operational amplifier 10, with positive pole on the same non-inverting input of the operational amplifier 10 and negative pole on the differential input 4a).

The offset Vos causes a different operating point of the output amplification stage 6, as shown in FIG. 3 with a dashed line (with reference to a possible example), highlighted in which is the new value of output current Iout" at the same output voltage Vout, which differs by a current deviation $\Delta I$ from the desired operating point Iout', and to which different values V1" and V2", for the differential voltages V1 and V2, correspond.

The operating point consequently comes to rest on different output characteristics, with a static operation point, which involves a possible increase in the consumption of static current. The current deviation $\Delta I$ has particularly negative effects in the case where the amplifier circuit 3 is used in the digital-to-analog converter 1 (as illustrated in FIG. 1), supplied by the charge pump 9. In fact, considering an inefficiency factor $\eta$ for the charge pump 9, the consumption of current by the electrical supply of the digital-to-analog converter device 1 has a total increase equal to $\eta \cdot \Delta I$. There may be a need to provide an improved approach for the amplifier circuit, which will enable the problems highlighted previously to be addressed, or at least attenuated.

With reference once again to FIGS. 2 and 4, the present disclosure notes that, in the absence of offset, the biasing point of the circuit $V_L = V_{L0}$ is such that $$V_1 = V_1' = V_2 = V_2' = V_0.$$

Figure 4:
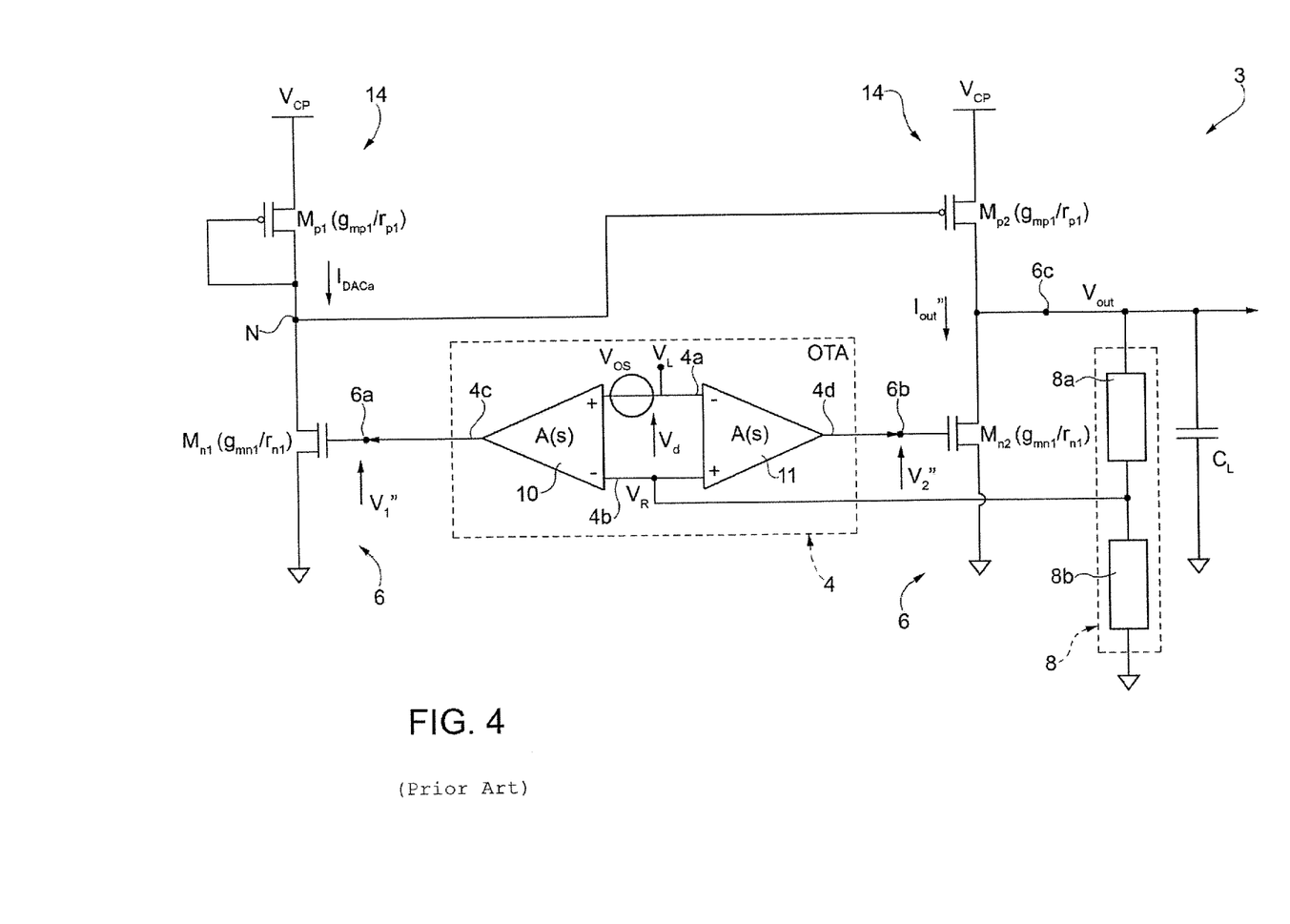
FIG. 4 is a schematic circuit diagram of the amplifier circuit of FIG. 1 in the presence of offset due to a mismatch in the circuit components.

In the presence of the discussed offset VOS, the value of the input voltage VL may no longer be equal to VL0. In fact, in this case we would have V1>>(V2=V0), and the system would not be in a condition of equilibrium. To return to a condition of equilibrium, the input voltage VL has to increase with respect to the situation without offset, forcing, on the one hand, the operational amplifier 11 to supply a value of V2=V2">V0 and, on the other, the operational amplifier 10 to supply a value of V1=V1">V0. Both transistors Mn1 and Mn2 thus work with higher currents with respect to what is desirable in the circuit without offset, albeit enabling the system to reach a situation of equilibrium.

The present disclosure notes that a level of current (and thus of consumption) higher than what desirable in the design stage is coupled to a value of the differential voltages V1 and V2 greater than V0. In other words, the common-mode value of the differential voltages V1 and V2 with respect to a reference value V0 is indicative of the current consumption. A high consumption is equivalent to a high value of V1 and V2 with respect to the reference value V0. A low consumption is equivalent to a low value of V1 and V2 with respect to the reference value V0.

As will be described in detail hereinafter, one aspect of the present disclosure is directed to an amplifier circuit. The amplifier circuit comprises an input stage with a pair of operational amplifiers operating in phase opposition on the same differential inputs, for example, for use in a digital-to-analog converter device, of a common-mode control stage, coupled to the differential outputs of the operational amplifiers in order to eliminate, or at least reduce, the undesirable effects of consumption associated to mismatches in the circuit components that may be present in the amplifier circuit.

Figure 5:
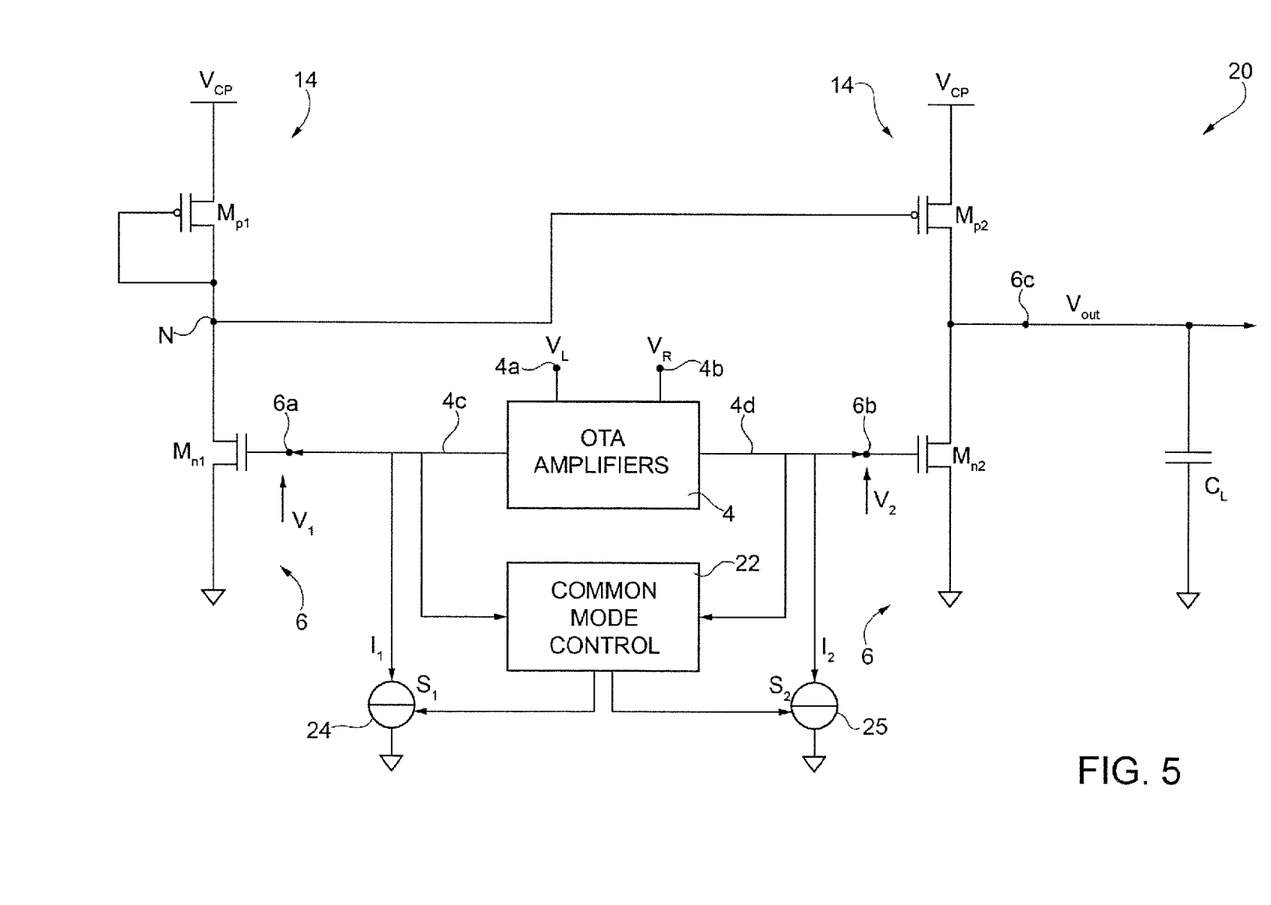
FIG. 5 is a schematic circuit diagram of an amplifier circuit, according to the present disclosure.

As illustrated in FIG. 5 (where elements that are similar to others already described previously are designated by the same reference numbers and are not described any further), the amplifier circuit, here designated by 20, has a configuration substantially similar to what has been discussed previously with reference to FIG. 2, and in particular includes an input amplification stage 4 (here illustrated schematically) having a differential configuration with two operational amplifiers with inputs in parallel and phase opposition, and an output amplification stage 6. For reasons of simplicity of illustration, the divider stage 8, which is in any case present and supplies the feedback voltage VR to the input 4b of the input amplification stage 4, is not illustrated in FIG. 5.

According to one aspect, the amplifier circuit 20 further comprises a common-mode control stage 22, coupled to the differential outputs 4c, 4d of the input amplification stage 4. The common-mode control stage 22 is configured to react to a common-mode variation of the differential voltages V1 and V2, imposing a current of appropriate value on the gate terminals of the NMOS output transistors Mn1, Mn2 in order to eliminate, or at least reduce, the common-mode variation and regulate the value of the differential voltages V1 and V2 around the desired working point (to reduce accordingly the current deviation AI and the static consumption associated thereto).

In particular, a respective current generator 24, 25 is in this case coupled to the gate terminal of the NMOS output transistors Mn1, Mn2 in order to force a respective regulation current I1, I2. Current generators 24, 25 are controlled, with a respective control signal S1, S2 by the common-mode control stage 22, which, in a possible embodiment, is configured to compare the value of the differential voltages V1 and V2 with a target value generated internally and generate the control signals S1, S2 as a function of the comparison result to control the value of the regulation currents I1, I2.

Figure 6:
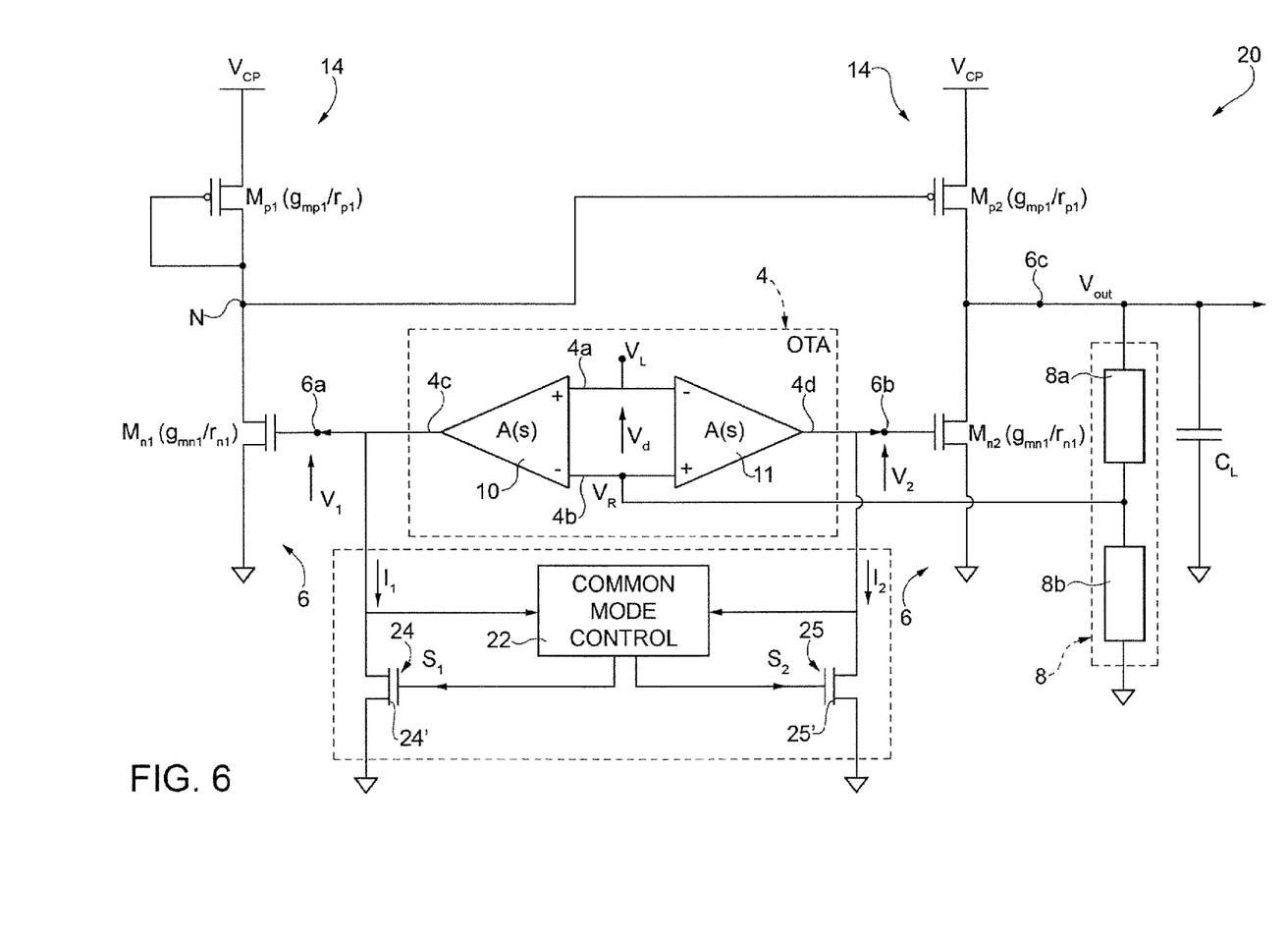
FIG. 6 is a more detailed schematic circuit diagram of the amplifier circuit of FIG. 5.

As illustrated in greater detail in FIG. 6 (where operational amplifiers 10, 11 of the input amplification stage 4 are illustrated), in a possible embodiment, the current generators 24, 25 are implemented by a respective NMOS generator transistor 24', 25', each of which has its gate terminal that is coupled to a respective output of the common-mode control stage 22 and receives the respective control signal S1, S2, a first conduction terminal coupled to the gate terminal of the respective NMOS output transistor Mn1, Mn2, and a second conduction terminal coupled to ground.

Operation of the common-mode control stage 22 envisions in general reaction to a common-mode variation of the differential voltages V1 and V2 (due in particular to an offset Vos—here not shown—associated to mismatches in the characteristics of the circuit components) by forcing a corresponding current I1, I2 on the gate terminals of the NMOS output transistors Mn1, Mn2 in such a way as to cause a consequent variation of the differential voltages V1 and V2, bringing the amplifier circuit 20 back to the desired working point (thus compensating the presence of the offset Vos). This common-mode-control mechanism adds to the feedback control loop for control of the output voltage Vout as a function of the input voltage VL, given that, advantageously, it is much faster than the same feedback control loop.

Figure 7:
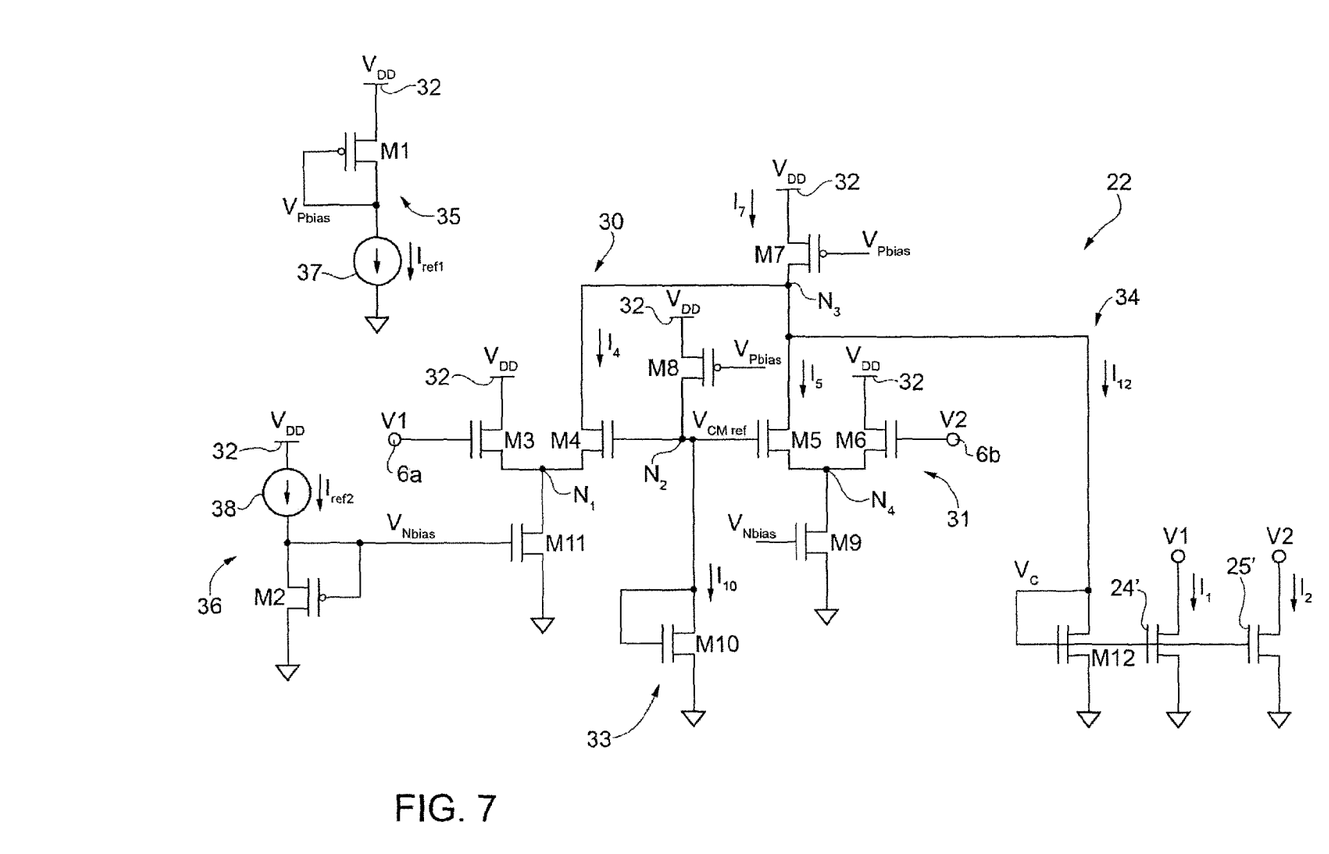
FIG. 7 is a more detailed schematic circuit diagram of the control circuit for the amplifier circuit of FIG. 5.

With reference to FIG. 7, a possible circuit implementation of the common-mode control stage 22 is now discussed, which implements the control mechanism described previously and comprises: a first differential branch 30 and a second differential branch 31, which are coupled, respectively, to the first and second inputs 6a, 6b of the output amplification stage 6. In detail, the first differential branch 30 includes: a first NMOS transistor M3, having its gate terminal that is coupled to the first input 6a and receives the differential voltage V1, a first conduction terminal that is coupled to a supply terminal 32 (and receives the supply voltage VDD), and a second conduction terminal coupled to a first internal node N1; a second NMOS transistor M4, having its gate terminal coupled to a second internal node N2, a first conduction terminal coupled to a third internal node N3, and a second conduction terminal which is also coupled to the first internal node N1; and a third NMOS transistor M11 having its gate terminal that receives a first biasing voltage VNbias, a first conduction terminal coupled to the first internal node N1, and a second conduction terminal coupled to ground.

Analogously, the second differential branch 31 includes a respective first NMOS transistor M6, having its gate terminal that is coupled to the second input 6b and receives the differential voltage V2, a first conduction terminal coupled to the supply terminal 32, and a second conduction terminal coupled to a fourth internal node N4. The second differential branch 31 includes a respective second NMOS transistor M5, having its gate terminal coupled to the second internal node N2, a first conduction terminal coupled to the third internal node N3, and a second conduction terminal, which is also coupled to the fourth internal node N4, and a respective third NMOS transistor M9 having its gate terminal that receives the first biasing voltage VNbias, a first conduction terminal coupled to the fourth internal node N4, and a second conduction terminal coupled to ground.

The common-mode control stage 22 further comprises a reference-generator branch 33 including: a PMOS reference transistor M8, having its gate terminal that receives a second biasing voltage VPbias, a first conduction terminal coupled to the supply terminal 32, and a second conduction terminal coupled to the second internal node N2; and a diode-coupled NMOS reference transistor M10, having a first conduction terminal coupled to the second internal node N2, its gate terminal coupled to the first conduction terminal, and a second conduction terminal coupled to ground. The common-mode control stage 22 further comprises a control branch 34, including: an NMOS control transistor M12, and a PMOS current-supply transistor M7.

The NMOS control transistor M12, which is diode-coupled, has a first conduction terminal coupled to the third internal node N3, its gate terminal, which is coupled to the first conduction terminal and on which a control voltage Vc is present, and a second conduction terminal coupled to ground. Furthermore, the gate terminal of the NMOS control transistor M12 is coupled to the gate terminal of both NMOS generator transistors 24', 25', and the control voltage Vc thus determines the value of the regulation currents I1, I2, thus in this case constituting the respective control signal S1, S2.

The PMOS current-supply transistor M7 has a first conduction terminal coupled to the supply terminal 32, its gate terminal receiving the second biasing voltage VPbias, and a second conduction terminal coupled to the third internal node N3. The common-mode control stage 22 further comprises: a p-biasing generator 35 and an n-biasing generator 36. The p-biasing generator 35 includes a diode-coupled PMOS transistor M1, having a first conduction terminal that is coupled to the supply terminal 32 (and receives the supply voltage VDD), a second conduction terminal, which is coupled to a first reference-current generator 37 (in turn coupled to ground) and generates a first reference current Iref1, and its gate terminal, which is coupled to the second conduction terminal and on which the second biasing voltage VPbias is present. The n-biasing generator 36 includes: a diode-coupled PMOS transistor M2, having a first conduction terminal, which is coupled to a second reference-current generator 38 (in turn coupled to the supply terminal 32) and generates a second reference current Iref2, a second conduction terminal coupled to ground, and its gate terminal, which is coupled to the first conduction terminal and on which the first biasing voltage VNbias is present.

During operation of the common-mode control stage 22, the PMOS reference transistor M8 and NMOS reference transistor M10 determine on the second internal node N2 generation of a common-mode reference voltage VCMref, the value of which is indicative of the working point (and of the associated consumption of static current) desired for the amplifier circuit 3 (which varies as a function of the working conditions of the same amplifier circuit 3). The first and second differential branches implement the comparison between the first differential voltage V1 and the second differential voltage V2, respectively, and the common-mode reference voltage VCMref, and generate an unbalancing current I4 and I5, respectively, as a function of the comparison. The control current I12 that circulates in the NMOS control transistor M12 is a function of the current I7 generated by the PMOS current-supply transistor M7 and of the value of the unbalancing currents I4 and I5 and in turn determines the value of the regulation currents I1, I2 and thus of the differential voltages V1 and V2, according to the action of control exerted by the common-mode control stage 22.

Basically, the NMOS control transistor M12 forms a current mirror with the NMOS generator transistors 24', 25', and the regulation currents I1, I2 are determined by the value of the control current I12 and by a respective mirroring factor. In particular, for high values of both differential voltages V1 and V2 (on account of the presence of the offset Vos at the inputs of the input amplifier stage 4), the unbalancing currents I4 and I5 have a low value, and substantially all the current I7 generated by the PMOS current-supply transistor M7 circulates in the NMOS control transistor M12, causing an increase of the control current I12. Consequently, the control voltage Vc rises, and the regulation currents I1, I2 also rise, causing a corresponding decrease of differential voltages V1 and V2. The common-mode control stage 22 thus reacts to the presence of a simultaneous increase of the differential voltages V1 and V2 by causing rapid decrease thereof and return to a desired working point of the amplification circuit 3.

If the differential voltages V1 and V2 both have, instead, a low value, the current I7 generated by the PMOS current-supply transistor M7 circulates substantially entirely through NMOS transistors M4 and M5 of the two differential branches so that the control current I12 in the NMOS control transistor M12 has a low value, thus determining a corresponding low value of the regulation currents I1, I2 (in this case, the control action is substantially negligible).

During the transients (i.e. a dynamic working condition), when the differential voltages V1 and V2 have values very different from one another and in phase opposition, the unbalancing currents I4 and I5 have substantially opposite variations, thus determining a substantially negligible resulting variation of the control current I12 and a corresponding negligible control action by the control voltage Vc. In other words, the control action exerted by the common-mode control stage 22 does not affect the dynamic operation of the amplifier circuit 3. Furthermore, the same common-mode control action is, due to the circuit configuration described, very fast as compared to the differential control loop implemented by the amplifier circuit 3.

The advantages of the approach disclosed herein are clear from the foregoing description. In particular, the amplifier circuit 20 may enable elimination, or in any case reduction, of the effects of possible mismatches between the components, which could cause lack of symmetry in the inputs of the operational amplifiers and a consequent offset Vos. In this way, the static consumption of the amplifier circuit 20 does not undergo undesirable increases.

Figure 8A:
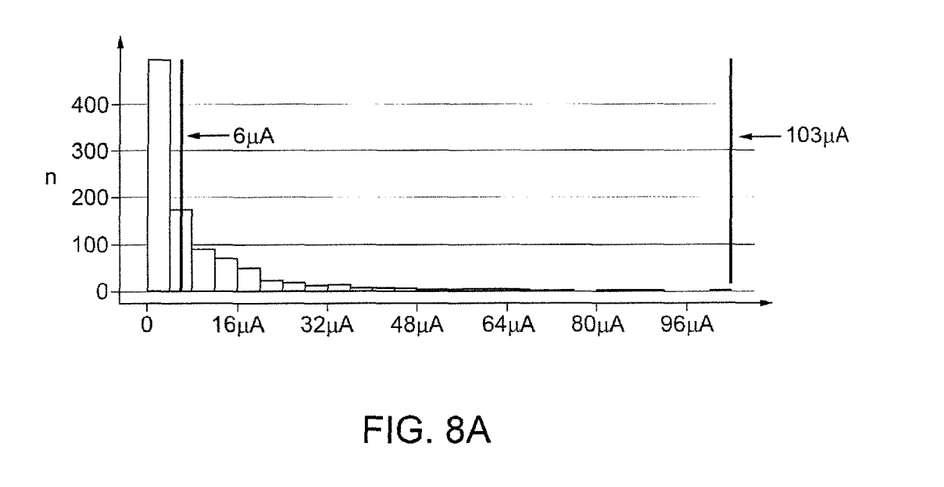
FIGS. 8a and 8b are diagrams for performance of the amplifier circuit of FIG. 5.
Figure 8B:
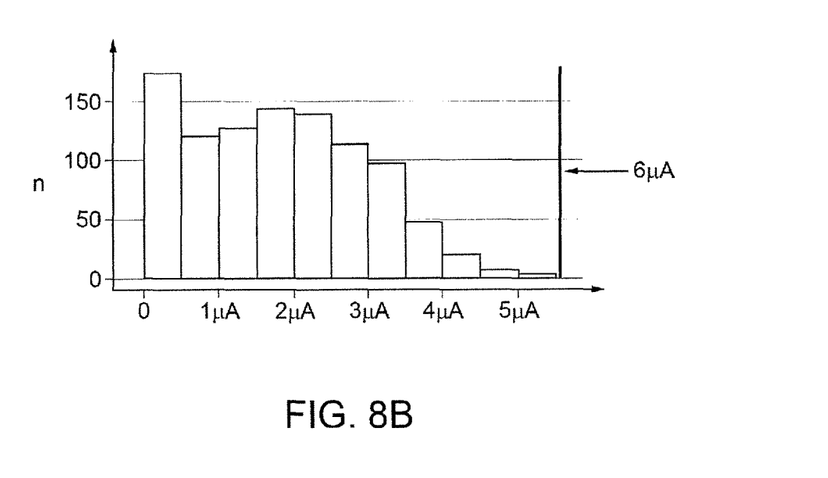

In this regard, FIGS. 8a and 8b compare the static current consumption of an amplifier circuit according to the typical approach (i.e. without a compensation stage, for example, as described in FIG. 2) and of the amplifier circuit 20 according to the present disclosure, provided with the common-mode control stage 22. As highlighted by the statistical distribution illustrated in FIG. 8a, the static current consumption of the circuit according to the typical approach has a maximum value of approximately 103 µA, and a mean value of approximately 9 µA. The amplifier circuit 20 according to the present disclosure, as illustrated in FIG. 8b, has, instead, a maximum static current consumption of approximately 6 µA, with a mean value of just 1.8 µA.

Advantageously, the reduction in the static current consumption may be obtained without altering the dynamic characteristics of gain and phase of the amplification stage and the characteristics of the external differential-voltage control loop. In particular, the present approach described does not introduce any resistive and/or capacitive loads in the control loop and does not alter the stability characteristics thereof.

Furthermore, the circuit configuration of the common-mode control stage 22 envisions the use of solely low-voltage transistors, with a consequent low total occupation of area. The characteristics highlighted may be particularly advantageous in the case where the amplifier circuit 20 is used in combination with a charge pump (as in the digital-to-analog converter 1), a case where the poor efficiency of the same charge pump would amplify in fact possible current deviations and consequently the associated static consumption levels.

Figure 9:
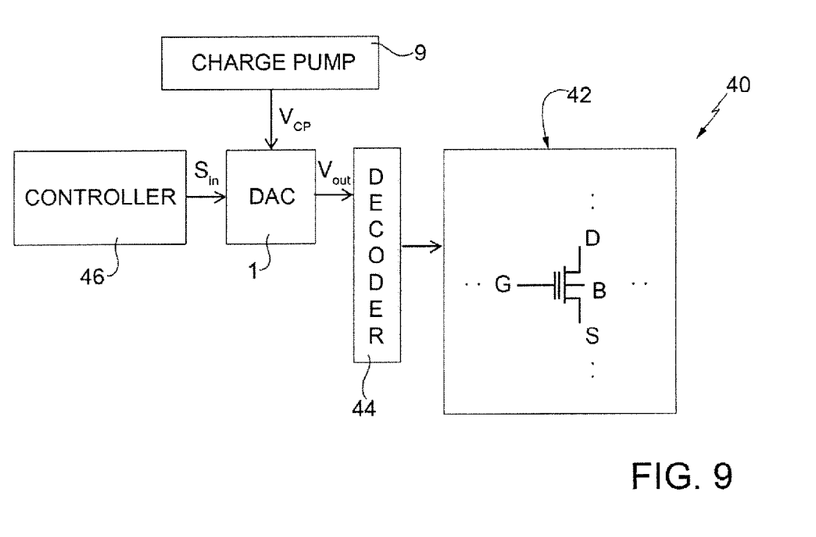
FIG. 9 is a schematic block diagram of a memory device including the digital-to-analog converter device and the corresponding amplifier circuit from FIG. 5.

In this regard, FIG. 9 is a schematic representation of a nonvolatile memory device 40, in particular of the flash type (only the parts relevant for the present discussion are illustrated in FIG. 9). The nonvolatile memory device 40 comprises: an array of memory cells 42 (only one of which is illustrated by way of example); a decoder 44, designed to address the memory cells 42 for reading and programming operations; the digital-to-analog converter device, designated once again by 1, which is coupled to the decoder 44 and includes the amplifier circuit 20; the charge pump 9, which supplies the boosted voltage VCP to the amplifier circuit 20; and a controller 46, for example including a microprocessor or a microcontroller (or similar processing element), coupled to the digital-to-analog converter device 1.

The controller 46 supplies the digital input signals Sin, indicating the biasing voltage that is to be generated, to the digital-to-analog converter device 1, according to the read or program (or verify) operations that are to be carried out. The digital-to-analog converter 1 consequently generates the output voltages Vout, which subsequently reach the memory cells 42 via the decoder 44.

Finally, it is clear that modifications and variations may be made to what has been described and illustrated herein, without thereby departing from the scope of the present disclosure, as defined in the annexed claims. In particular, it is once again emphasized that the approach described may find advantageous application in all devices that envision use of an amplifier circuit with a differential input stage including a pair of operational amplifiers with inputs in common and in phase opposition, in order to reduce the static current consumption due to offsets present on the same inputs.

That which is claimed is:

1. An amplifier circuit comprising:
   an input amplification stage comprising
      a first amplifier having first and second differential inputs and a first output, and
      a second amplifier having first and second differential inputs and a second output
      the first differential input of the first amplifier being coupled to the second differential input of the second amplifier and configured to receive an input voltage, and
      the second differential input of the first amplifier being coupled to the first differential input of the second amplifier and configured to receive a feedback voltage;
   an output amplification stage having
      first and second inputs respectively coupled to the first and second outputs of said input amplification stage, and
      an output configured to supply an output voltage based upon the input voltage and an amplification factor; and
   a feedback stage coupled to the output of said output amplification stage and configured to generate the feedback voltage based upon the output voltage, said feedback stage comprising
      a common-mode control stage coupled to the first and second outputs of said input amplification stage for receiving a first differential voltage and a second differential voltage, respectively,
      said common-mode control stage configured to
         implement a comparison between the first differential voltage and the second differential voltage, and a reference voltage, and
         generate respective regulation currents on the first and second inputs of said output amplification stage to compensate for a common-mode variation of the first differential voltage and the second differential voltage.

2. The amplifier circuit according to claim 1 wherein said feedback stage comprises:
   a first current generator coupled to the first input of said output amplification stage; and
   a second current generator coupled to the second input of said output amplification stage;
   said common-mode control stage configured to generate, based upon the comparison, a first control signal and a second control signal for respectively controlling said first current generator and said second current generator for generation of the respective regulation currents.

3. The amplifier circuit according to claim 2 wherein said first current generator and said second current generator each comprises a transistor having:
   a control terminal coupled to said common-mode control stage and configured to respectively receive the first control signal and the second control signal;
   a first conduction terminal coupled respectively to the first and second inputs of said output amplification stage; and
   a second conduction terminal coupled to a second reference voltage.

4. The amplifier circuit according to claim 1 wherein said common-mode control stage comprises:
   a reference-generator branch configured to generate the reference voltage;
   first and second differential branches configured to compare the first differential voltage and the second differential voltage, respectively, with the reference voltage and generate a first unbalancing current and a second unbalancing current, respectively; and
   a control branch configured to generate the respective regulation currents based upon the first unbalancing current and the second unbalancing current.

5. The amplifier circuit according to claim 4 wherein said control branch comprises:
   a current-supply transistor having a conduction terminal coupled to said first differential branch and said second differential branch and configured to generate a supply current; and
   a diode-coupled control transistor coupled to said conduction terminal of said current-supply transistor;
   wherein a control current passing through said diode-coupled control transistor is based upon the supply current and the first and second unbalancing currents.

6. The amplifier circuit according to claim 5 wherein said common-mode control stage comprises a first generator transistor and a second generator transistor coupled in current-mirror configuration to the diode-coupled control transistor and configured to generate the respective regulation currents based upon said control current and a respective mirroring factor.

7. The amplifier circuit according to claim 1 wherein said feedback stage comprises a divider configured to generate the feedback voltage as a division of the output voltage.

8. The amplifier circuit according to claim 1 wherein said output amplification stage comprises:
a first output transistor having first and second conductions terminals coupled between an internal node and a third reference voltage, and a control terminal coupled to said first input of said output amplification stage;
a second output transistor having first and second conduction terminals coupled between said output of said output amplification stage and the third reference voltage, and a control terminal coupled to the second input of said output amplification stage; and
a current mirror configured to be supplied by a supply voltage and having a first mirroring branch and a second mirroring branch coupled to the internal node and to said output of said output amplification stage, respectively.

9. The amplifier circuit according to claim 1 wherein said first amplifier and said second amplifier each comprises a transconductance amplifier of a fully differential type.

10. An amplifier circuit comprising:
an input amplification stage comprising first and second amplifiers having inputs coupled together and configured to receive an input voltage and a feedback voltage;
an output amplification stage having first and second inputs coupled to said input amplification stage, and an output configured to supply an output voltage based upon the input voltage and an amplification factor; and
a feedback stage coupled to the output of said output amplification stage and configured to
generate the feedback voltage based upon the output voltage,
implement a comparison between a first differential voltage and a second differential voltage, and a reference voltage, and
generate respective regulation currents on the first and second inputs of said output amplification stage to compensate for a common-mode variation of the first differential voltage and the second differential voltage.

11. The amplifier circuit according to claim 10 wherein said feedback stage comprises:
a first current generator coupled to the first input of said output amplification stage;
a second current generator coupled to the second input of said output amplification stage; and
a common-mode control stage configured to generate, based upon the comparison, a first control signal and a second control signal for respectively controlling said first current generator and said second current generator for generation of the respective regulation currents.

12. The amplifier circuit according to claim 11 wherein said first current generator and said second current generator each comprises a transistor having;
a control terminal coupled to said common-mode control stage and configured to respectively receive the first control signal and the second control signal;
a first conduction terminal coupled respectively to the first and second inputs of said output amplification stage; and
a second conduction terminal coupled to a second reference voltage.

13. The amplifier circuit according to claim 11 wherein said common-mode control stage comprises:

a reference-generator branch configured to generate the reference voltage;
first and second differential branches configured to compare the first differential voltage and the second differential voltage, respectively, with the reference voltage and generate a first unbalancing current and a second unbalancing current, respectively; and
a control branch configured to generate the respective regulation currents based upon the first unbalancing current and the second unbalancing current.

14. A digital-to-analog converter device comprising:
an amplifier circuit comprising
an input amplification stage comprising first and second amplifiers having inputs coupled together and configured to receive an input voltage and a feedback voltage,
an output amplification stage having first and second inputs coupled to said input amplification stage, and an output configured to supply an output voltage based upon the input voltage and an amplification factor, and
a feedback stage coupled to the output of said output amplification stage and configured to
generate the feedback voltage based upon the output voltage,
implement a comparison between a first differential voltage and a second differential voltage, and a reference voltage, and
generate respective regulation currents on the first and second inputs of said output amplification stage to compensate for a common-mode variation of the first differential voltage and the second differential voltage;
an input conversion stage configured to receive a digital signal and to generate the input voltage for said amplifier circuit; and
a charge-pump stage configured to generate a supply voltage having a boosted value with respect to an input for said output amplification stage.

15. The digital-to-analog converter device according to claim 14 wherein said feedback stage comprises:
a first current generator coupled to the first input of said output amplification stage;
a second current generator coupled to the second input of said output amplification stage; and
a common-mode control stage configured to generate, based upon the comparison, a first control signal and a second control signal for respectively controlling said first current generator and said second current generator for generation of the respective regulation currents.

16. The digital-to-analog converter device according to claim 15 wherein said first current generator and said second current generator each comprises a transistor having:
a control terminal coupled to said common-mode control stage and configured to respectively receive the first control signal and the second control signal;
a first conduction terminal coupled respectively to the first and second inputs of said output amplification stage; and
a second conduction terminal coupled to a second reference voltage.

17. The digital-to-analog converter device according to claim 15 wherein said common-mode control stage comprises:
a reference-generator branch configured to generate the reference voltage;

first and second differential branches configured to compare the first differential voltage and the second differential voltage, respectively, with the reference voltage and generate a first unbalancing current and a second unbalancing current, respectively; and a control branch configured to generate the respective regulation currents based upon the first unbalancing current and the second unbalancing current.

18. The digital-to-analog converter device according to claim 14 further comprising an array of memory cells coupled to said charge-pump stage.

19. A method for controlling an amplifier circuit comprising an input amplification stage comprising first and second amplifiers having inputs coupled together and configured to receive an input voltage and a feedback voltage, an output amplification stage having first and second inputs coupled to said input amplification stage, and an output configured to supply an output voltage based upon the input voltage and an amplification factor, and a feedback stage coupled to the output of said output amplification stage, the method comprising:

operating the feedback stage to generate the feedback voltage based upon the output voltage;

operating the feedback stage to implement a comparison between a first differential voltage and a second differential voltage, and a reference voltage; and operating the feedback stage to generate respective regulation currents on the first and second inputs of said output amplification stage to compensate for a common-mode variation of the first differential voltage and the second differential voltage.

20. The method according to claim 19 further comprising generating, based upon the comparison, a first control signal and a second control signal for respectively controlling a first current generator and a second current generator for generation of the respective regulation currents.

21. The method according to claim 19 wherein the first amplifier and the second amplifier each comprises a transconductance amplifier of a fully differential type.

* * * * *